United States Patent [19]

McKaveney

[11] 4,197,218

[45] Apr. 8, 1980

[54] ELECTRICALLY CONDUCTIVE ARTICLES

[75] Inventor: James P. McKaveney, Claremont, Calif.

[73] Assignee: Hooker Chemicals & Plastics Corp., Niagara Falls, N.Y.

[21] Appl. No.: 871,730

[22] Filed: Jan. 23, 1978

Related U.S. Application Data

[63] Continuation-in-part of Ser. No. 853,653, Nov. 21, 1977.

[51] Int. Cl.$^2$ .......................... H01B 1/04; H01B 1/02
[52] U.S. Cl. ..................................... 252/503; 252/504; 252/506; 252/509; 252/511; 252/512; 252/513; 252/516; 252/518; 252/521
[58] Field of Search ............... 252/513, 512, 511, 503; 75/123 B, 123 D, 134 S; 106/97

[56] References Cited

U.S. PATENT DOCUMENTS

| | | | |
|---|---|---|---|
| 2,159,805 | 5/1939 | Lenz et al. | 75/123 D X |
| 2,159,808 | 5/1939 | Lenz et al. | 75/123 B X |
| 2,661,282 | 12/1953 | Daley | 75/123 D X |
| 3,408,524 | 10/1968 | Blum et al. | 252/512 X |
| 3,484,284 | 12/1969 | Dates et al. | 252/513 X |
| 3,668,150 | 6/1972 | Horvitz | 252/513 X |
| 3,709,835 | 1/1973 | Forster | 252/513 |
| 3,854,940 | 12/1974 | Hoekje | 75/134 S |
| 3,904,555 | 9/1975 | Matsuda et al. | 252/513 X |
| 4,028,276 | 6/1977 | Harden et al. | 252/513 |
| 4,057,777 | 11/1977 | Merz et al. | 252/513 X |

FOREIGN PATENT DOCUMENTS 546021 2/1977 U.S.S.R. .................................. 252/512

*Primary Examiner*—E. Suzanne Parr
*Attorney, Agent, or Firm*—Peter F. Casella; William J. Crossetta, Jr.; Arthur S. Cookfair

[57] ABSTRACT

Electrically conductive articles which comprise a non-conductive matrix containing an electrically conductive dispersion of finely divided ferroalloy, silicon alloy, or mixtures thereof, are described. Compositions for making the articles utilizing various non-conductive materials, e.g., plastics, ceramics, and glass, are also described.

23 Claims, No Drawings

ELECTRICALLY CONDUCTIVE ARTICLES

This application is a continuation-in-part of copending application Ser. No. 853,653, filed Nov. 21, 1977.

BACKGROUND OF THE INVENTION

The present invention relates to electrically conductive articles and, in particular, to articles, or bodies, having a matrix of non-conducting material, such as plastic, ceramic material, or glass, with a substantially uniform dispersion of finely divided electrically conductive material distributed therein. The electrically conductive material of the present invention is comprised of ferroalloys, silicon alloys, or mixtures thereof.

One aspect of the present invention relates to compositions of plastic or elastomeric materials, that may be shaped or molded into electrically conductive articles having improved electrical conducting and physical properties.

Another aspect of the present invention relates to the production of ceramic, cement, or glass compositions that may be shaped or molded into electrically conductive articles having improved electrical conducting and physical properties.

Most materials may be classified according to their ability to conduct or impede the flow of electrical current. Metals are generally extremely good electrical conductors, while plastic materials are generally very good insulators. Electrical conductivity may be categorized to define good conductors as having a volume resistivity of between $10^{-6}$ and $10^0$ ohm-centimeter; semiconductors between $10^0$ and $10^8$ ohm-centimeter; and good insulators (poor conductors) between $10^8$ and $10^{12}$ ohm-centimeter.

Although the present invention is directed more to electrically conductive articles which are good conductors, it will be understood that the compositions of the present invention may be easily varied, by the use of lesser amounts of conductive material, to produce articles which are semiconductors. The term "electrically conductive," as used herein, shall include both good conductors and semiconductors.

The desirability of making electrically conductive shaped articles from plastics, elastomers, ceramic and glass materials has long been recognized. Electrically conductive articles frequently include a dispersion of noble metal powders, e.g., platinum, gold, or silver. The volume resistivity of such articles is usually in the order of about 0.1 ohm-centimeter or less. Although expensive, noble metals are employed to a great extent because non-noble metal powders, such as copper, nickel, or aluminum, form high resistance surface oxides. Even with meticulous cleaning and preparation to remove the oxides from non-noble metal surfaces, the oxides reform, and, over a period of time, the conductivity of the article containing such metals decreases.

The electrical conductivity of an article containing a dispersion of electrically conductive particles depends upon the particle-to-particle contact. To be a good conductor, electric current must flow from particle to particle with the lowest amount of contact resistance possible. In the case of non-noble metal powders, the oxide coating that forms, while perhaps only a few atoms thick, has a high electrical resistivity and prevents the ready flow of current between contiguous particles.

The expense of noble metal and the disadvantages of using non-metal powders have caused a number of alternate solutions to be suggested, for example, using various mixtures of noble and non-noble metal powders; coating non-noble metal powders with a noble metal; and processes for cleaning and maintaining the powder in a free metal form even at the point of incorporation into the non-conducting matrix. However, none of these alternatives has proven satisfactory from either the initial cost, preparation expense, or performance viewpoints.

The present invention utilizes an electrical conductive material which not only has an economic advantage over noble metals, but also over non-noble metals commonly used, while providing a conductivity comparable to that of powdered copper. The present conductive materials also have brittle properties enabling them to be pulverized, or processed into powder form, easier than the metals commonly used. The electrical conductivity of the articles of the present invention are comparable to those of the non-noble metals of prior art but are much less prone to the subsequent formation of oxide coatings that increase electrical resistance.

GENERAL DESCRIPTION OF THE INVENTION

The present invention relates to electrically conductive shaped articles, and to compositions for making such articles. The articles comprise a nonconductive matrix having a substantially uniform dispersion of finely divided particles of ferroalloys, silicon alloys, or mixtures thereof.

The term "matrix" as used herein, shall mean a material holding or capable of holding within itself other materials to which it gives shape or form.

The non-conductive matrix may suitably be a plastic or resin material. The terms "plastic" or "resin" as used herein, embrace any one of a large and varied group of materials, commonly referred to as "plastics" and "resins," characterized by the fact that they are organic substances of high molecular weight and may readily be molded into desired shapes under conventional molding or shaping techniques. Plastics that may be employed in the present invention may be chosen from the large group of molding substances that includes thermosetting materials such as phenolic and ureaformaldehyde resins, epoxy resins; thermoplastic materials such as polystyrene, polyethylene, polymethylmethacrylate, vinyl polymers and copolymers, cellulose acetate, silicone, polymonochlorotrifluoroethylene, polytetrafluoroethylene, and the like. The plastic or resin material may also contain filler materials, such as those commonly used in the art, for example, lubricants, plasticizers, dyes, pigments, organic and inorganic fillers.

The non-conductive matrix may be selected from elastomer materials, for example, artificial and natural rubber. Aptly suited are room temperature vulcanizing rubbers.

The non-conductive matrix may be selected from ceramic materials, for example, alumina, clays, fireclays including a binder such as portland cement, materials used in the art for the manufacture of tile, e.g., Bentonite, ball, clay, feldspar, flint, talc, and Wollastonite. The non-conductive matrix may also be glass.

Suitable ferroalloys for use in the present invention are those known as refractory ferroalloys. Such alloys include ferromanganese, ferromolybdenum, ferrosilicon, ferrochrome, ferrovanadium, ferrozirconium, ferrotitanium, ferrotungsten, ferroboron, ferrophosphorus, iron carbide, and mixtures thereof. Particularly preferred ferroalloys are ferrophosphorus and ferroboron.

Suitable silicon alloys or silicides for use in the present invention include steel-making alloys prepared by the ferroalloy industry and known in the trade as calsibar (CaSiBa), magnesium ferrosilicon (MgFeSi), hypercal (AlBaCaFeSi), siliconmanganese (SiMn), manganese ferrosilicon (MnFeSi), magnesium silicide ($Mg_2Si$), and calcium silicon (CaSi), as well as the silicides of cobalt, nickel, chromium, molybdenum, manganese, iron or the like.

The alloys or silicides employed in the compositions of the present invention are conveniently prepared by any suitable method known to the art, as for example, by carbon reduction of the active metal oxide such as lime (CaO) with silica ($SiO_2$) in a submerged-arc electric furnace typical of the ferroalloy industry.

The conductive metal alloys or silicides are dispersed in the nonconductive matrix in a finely divided form. Desirably, the conductive metal particles have an average size within the range of from about 2 to about 40 microns, preferably within the range of from about 5 to about 7 microns. The alloys or silicides may be conveniently comminuted by any suitable crushing or grinding operation, preferably in a carbon dioxide atmosphere to minimize any dust explosion hazard from the active alloy surface. Methods of preparation for the conductive metal particles are extensive and well known to those of skill in the art.

The amount of conductive material included in the compositions of the present invention may be varied through a considerable range without departing from the spirit of the present invention and will be dependent upon the desired characteristics and use of the finished article. The conductivity of the article is increased as the amount of conductive material is increased. The amounts of conductive materials included in the present compositions are those that are sufficient for electrical conductivity but less than that which will adversely affect the moldability or dimensional stability of the finished article. Generally, the amount of conductive material varies between about 5 and about 90 percent by weight of the composition; suitably a range between about 20 to about 80 percent by weight has been found useful; and, within this range, amounts between about 30 and about 80 percent by weight are eminently useful. In one embodiment, the refractory ferroalloy or silicon alloy electroconductive particles of this invention may be employed in admixture with electroconductive particles of other materials such as gold, silver, copper, graphite or the like in a suitable non-conductive matrix. Preferably such mixtures are formulated in a proportion about 20 to about 80 percent by weight of ferroalloy or silicon alloy particles and about 80 to about 20 percent by weight of particles of gold, silver, copper, graphite or the like based on the total weight of electro-conductive particles. In a preferred embodiment, the conductive material particles comprise a mixture of about 20 to about 80 percent by weight ferrophosphorus or ferrosilicon and about 80 to about 20 percent of graphite, based on the total weight of electroconductive particles.

Mixtures of the present conductive materials and other conductive materials, especially graphite, metal powders, may be utilized. However, the economic advantage and performance characteristics are to be considered. Generally, mixtures of conductive materials containing less than about 20 percent by weight of the conductive materials of the present invention are not advantageously employed.

Dispersion of the conductive material in the non-conductive matrix material may be effected by any of several known procedures, for example, by compounding the components in finely divided form, generally by milling or mixing. The non-conductive material, if a plastic material, may be utilized in a form in which the conductive material may be coated, or it may be utilized in a form in which the conductive material is merely stirred in, for example, elastomeric materials. The articles may then be shaped or molded, for example, casting or molding, with or without heat and pressure, by known prior art techniques.

DETAILED DESCRIPTION OF THE INVENTION

The electrically conductive articles of the present invention comprise a non-conductive matrix containing a dispersion of a finely divided ferroalloy, silicon alloy, or mixtures thereof. The compositions of the present invention are those thay may be shaped and, if needed, cured, or set, to produce the articles.

In the case of thermosetting resin materials, cements and ceramic materials, the shaped article is cured by heat treatment or chemical action using known prior art techniques. The cured articles can range from soft, flexible, rubber-like materials to rock hard solids.

In one mode of the present invention, the non-conducting matrix material is a plastic material. The plastic material may be dissolved in a suitable solvent and the conductive material dispersed therein by blending, the solvent removed by evaporation to yield a product that may be utilized directly to form an article or may be granulated to provide a feed material for a subsequent forming operation, e.g., injection molding. The plastic material may be mixed or compounded in particulate form with the conductive material. In such process, the non-conductive material is preferably finely divided, having a particle size of less than 10 microns, and, preferably, less than 5 microns. The components may be milled together to produce a molding composition. The molding composition may be subsequently cured by known techniques in the desired article shape. The plastic material may be thermoplastic, such as polyethylene. In such case, the resin may be heated to above its melting point and the particulate conductive material kneaded or stirred in the resin to obtain an intimate, homogeneous mixture, followed by shaping or forming into an article. The resin compositions are aptly suited to be extruded to produce electrically conductive rods or ribbons.

The conductive materials of the present invention may be incorporated into elastomeric compositions by simple blending or by incorporation during formulation. Aptly suited to use are room temperature vulcanizing siloxane compositions, such as those formed from vinylinethyl or polyphenol siloxane polymers.

In utilizing a non-conductive matrix of a ceramic material, the mixtures may be pressure molded and subsequently fired, or sintered, to produce a ceramic body. The latter procedure is particularly adapted to produce semi-conductive material useful in the production of spark plugs. Conductive mixtures of clays utilizing an inorganic binder such as portland cement may also be produced, the components being initially mixed and milled to produce a finely divided mixture suitably of a particle size ranging from about 2 to about 10 microns. Conductive cements may also be produced by admixing the present conductive material with finely divided portland cement or mixtures of portland cement with magnesium chloride and magnesium oxide.

Conductive glass compositions may be produced by mixing the conductive material of the present invention with glass-forming material or frit and forming an article by molding or casting.

The compositions of the present invention may be utilized to form switches, electrical contacts and connections, conductive rods, ribbons, tapes, bases for printed circuits, conductive cements, tile, glass conductive parts for electroplating, and metalplastic composites for automotive usage. The conductivity of the final product may be varied by the inclusion of more or less of the conductive material to produce good conductors or semiconductors. Once the articles are formed, the conductivity of the article remains constant, giving the article stable electrical properties similar to those heretofore obtained only with the inclusion of noble metal powders.

The following examples will serve to further illustrate the invention and the manner in which it may be practiced. The examples are set forth for purposes of illustration and are not to be construed as limitative of the present invention. In the examples, unless otherwise stated, all parts and percentages are by weight and all temperatures are in degrees Celsius.

EXAMPLES 1–15

A quantity of ferrophosphorus (FeP) was crushed and screened to powder form having an average particle size of less than about 35 microns and intimately mixed with particles of polyvinyl chloride (PVC) having an average particle size of about one micron, in a weight proportion of about 9:1 of FeP:PVC. The mixture was pressed at 14 tons/square inch for about 10 seconds into the form of pellets having a 2.54 cm diameter and a thickness of about 0.3 cm. Resistivity was measured across the thickness of the pellets and was found to be 10.9 ohms per centimeter.

The foregoing process was repeated except that particles of various other ferroalloys or silicon alloys were substituted for ferrophosphorus and the weight ratio was varied as shown in Table 1, below. For comparative purposes pellets were similarly prepared employing copper or zinc metal in place of the ferrophosphorus (Example 5 and 6).

TABLE 1

Electrical Resistivity and Conductivity of Ferroalloys and Silicon Alloys in PVC Resins

| Example No. | Material | Alloy/PVC (gram ratio) | Resistivity (ohms per cm) | Conductance (mhos per cm) |
|---|---|---|---|---|
| 1 | FeP | 9:1 | 10.9 | $9.2 \times 10^{-2}$ |
| 2 | FeP | 8:2 | 84.8 | $1.2 \times 10^{-2}$ |
| 3 | FeP | 7:3 | $7.75 \times 10^{+3}$ | $1.3 \times 10^{-4}$ |
| 4 | FeP | 6:4 | $>9 \times 10^{6}$ | $<1.1 \times 10^{-7}$ |
| 5 | Cu | 9:1 | $>9 \times 10^{6}$ | $<1.1 \times 10^{-7}$ |
| 6 | Zn | 9:1 | $>9 \times 10^{6}$ | $<1.1 \times 10^{-7}$ |
| 7 | 50% FeSi* | 9:1 | 30.1 | $3.3 \times 10^{-2}$ |
| 8 | 50% FeSi* | 8:2 | $1.9 \times 10^{3}$ | $5.3 \times 10^{-4}$ |
| 9 | 50% FeSi* | 7:3 | $>9 \times 10^{6}$ | $<1.1 \times 10^{-7}$ |
| 10 | FeMnSi | 8:2 | $3.2 \times 10^{4}$ | $3.1 \times 10^{-5}$ |
| 11 | CaSi | 8:2 | $1.2 \times 10^{6}$ | $8.3 \times 10^{-7}$ |
| 12 | 5% MgFeSi** | 8:2 | $>9 \times 10^{6}$ | $<1.1 \times 10^{-7}$ |
| 13 | FeP/Graphite | 1.0:0.35:1 | $2.7 \times 10^{2}$ | $3.7 \times 10^{-3}$ |
| 14 | FeP/Graphite | 0.5:0.5:1 | 57.5 | $1.7 \times 10^{-2}$ |
| 15 | FeSi/Graphite | 0.5:0.5:1 | $1.12 \times 10^{2}$ | $0.9 \times 10^{-3}$ |

*Metallurgical grade ferrosilicon containing approximately 50% silicon.
**Metallurgical grade magnesium ferrosilicon containing approximately 5% magnesium.

EXAMPLES 16–18

A quantity of ferrophosphorus (FeP) was crushed and screened as in the previous examples to a particle size of less than about 35 microns. The particles were intimately mixed with sodium silicate (water glass) having a specific gravity of 1.41 and a water content of about 60% by weight. An equal weight of water was added to the mixture and the resultant mixture was formed into cylindrical rods of about 0.80 cm diameter and 4.5 cm length and allowed to air dry overnight. Resistivity was measured along the length of the rods and found to be 2.7 ohms per centimeter.

Similar rods of sodium silicate mixtures were similarly prepared except that FeSi (Example 17) and graphite (Example 18) particles of similar size were substituted for the ferrophosphorus particles.

TABLE 2

Electrical Resistivity and Conductivity of Ferroalloy Powders in Water Glass ($Na_2SiO_3$) Rods

| Example No. | Material (grams) | Water Glass (grams) | Water Added (grams) | Resistivity (ohms/cm) | Conductivity (mhos/cm) |
|---|---|---|---|---|---|
| 16 | FeP (8.0 g) | 2.0 | 2.0 | 2.7 | 0.37 |
| 17 | FeSi (8.0 g) | 2.0 | 2.0 | 3.3 | 0.30 |
| 18 | Graphite (8.0 g) | 2.0 | 2.0 | 7.3 | 0.14 |

EXAMPLES 19–22

A quantity of ferrophosphorus particles having an average particle size of less than about 35 microns was mixed with an equal weight of powdered cement and water was added and mixed therewith in an amount sufficient to form a pourable mixture. The mixture was poured into a plastic cylindrical container having an inside diameter of about 3.2 cm and allowed to dry overnight. The plastic container was removed and the resistivity of the resultant cylinder, having a diameter of about 3.2 and a length of about 3.5 cm, was measured and found to be $9.2 \times 10^2$ ohms per centimeter.

The foregoing procedure was repeated except that an equal weight of FeSi (Ex. 20) and Cu (Comparative Ex. 21), was substituted for the ferrophosphorus. In addition, for purposes of comparison a sample of cement containing no additive, was prepared.

TABLE 3

Electrical Resistivity and Conductivity of Ferroalloys in Cement Cylinders

| Example No. | Material | Resistivity (ohms/cm) | Conductivity (mhos/cm) |
|---|---|---|---|
| 19 | FeP/cement 50/50 | $9.2 \times 10^{2}$ | $1.1 \times 10^{-3}$ |
| 20 | FeSi/cement | $5.4 \times 10^{4}$ | $1.9 \times 10^{-5}$ |

TABLE 3-continued

Electrical Resistivity and Conductivity of Ferroalloys in Cement Cylinders

| Example No. | Material | Resistivity (ohms/cm) | Conductivity (mhos/cm) |
|---|---|---|---|
| 21 | 50/50 Cu/cement | $7.6 \times 10^5$ | $<1.3 \times 10^{-6}$ |
| 22 | 50/50 Cement 100% | $1.3 \times 10^6$ | $<7.7 \times 10^{-7}$ |

In an alternative embodiment the refractory ferroalloy or silicon alloy particles disclosed herein may be uniformly dispersed in a matrix of grease, paste, or the like to form an electoconductive grease or paste useful in various applications such as the protection or lubrication of electrical contact surfaces, pipe threads or the like when it is desired to form, improve or maintain the continuity of, electrical conductivity.

The present invention has been described with respect to several illustrative embodiments, but is not to be limited to these, as it will be evident to one of ordinary skill in the art that substitutions and equivalents are possible without departing from the spirit of the invention or the scope of the claims.

What is claimed is:

1. An electrically conductive article comprised of a matrix of a non-conductive material containing a substantially uniform dispersion of a finely divided conductive refractory ferroalloy material selected from ferroboron, ferrophosphorus, and mixtures thereof.

2. The article of claim 1 wherein the conductive material comprises from about 5 to about 90 percent by weight of the article.

3. The article of claim 1 wherein the conductive material is ferrophosphorus.

4. The article of claim 1 wherein the conductive material is ferroboron.

5. The conductive material of claim 1 wherein the conductive material has a size ranging between about 2 and about 40 microns.

6. The article of claim 1 wherein the non-conductive matrix material is plastic.

7. The article of claim 1 wherein the non-conductive matrix is an elastomeric material.

8. The article of claim 1 wherein the non-conductive matrix is glass.

9. The article of claim 1 wherein the non-conductive matrix is a ceramic material.

10. The article of claim 9 wherein the conductive material is ferrophosphorus.

11. The article of claim 10 wherein the conductive material is ferroboron.

12. A molding composition comprising a finely divided mixture of a moldable non-conductive material and a conductive refractory ferroalloy material selected from the group, ferroboron, ferrophosphorus, and mixtures thereof.

13. The composition of claim 12 wherein the moldable non-conductive material is plastic.

14. The composition of claim 12 wherein the conductive material is ferrophosphorus.

15. The composition of claim 12 wherein the conductive material is ferroboron.

16. The composition of claim 12 wherein the non-conductive material is ceramic.

17. The composition of claim 15 wherein the non-conductive material is rubber.

18. The composition of claim 12 wherein the conductive material comprises from about 5 to about 95 percent by weight of the composition.

19. The composition of claim 12 wherein the conductive material ranges in size from about 2 to about 40 microns.

20. The composition of claim 1 wherein the conductive material is a mixture of refractory ferroalloy with graphite.

21. The composition of claim 12 wherein the conductive material is a mixture of refractory ferroalloy with graphite.

22. An electrically conductive material comprising a matrix of grease containing a substantially uniform dispersion of finely divided conductive particles selected from refractory ferroalloys of the group ferromanganese, ferromolybdenum, ferrosilicon, ferrochrome, ferrovanadium, ferrozirconium, ferrotitanium, ferrotungsten, ferroboron, ferrophosphorus, iron carbide, or mixtures thereof.

23. An electrically conductive article comprised of a matrix of portland cement containing a substantially uniform dispersion of a finely divided conductive refractory ferroalloy material selected from the group ferromanganese, ferromolybdenum, ferrosilicon, ferrochrome, ferrovanadium, ferrozirconium, ferrotitanium, ferrotungsten, ferroboron, ferrophosphorus, iron carbide and mixtures thereof.

* * * * *